(12) United States Patent
Lee

(10) Patent No.: US 10,522,195 B2
(45) Date of Patent: Dec. 31, 2019

(54) MEMORY SYSTEM AND METHOD FOR OPERATING THE SAME

(71) Applicant: SK hynix Inc., Gyeonggi-do (KR)

(72) Inventor: Hyun Chul Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/958,866

(22) Filed: Apr. 20, 2018

(65) Prior Publication Data

US 2019/0080728 A1    Mar. 14, 2019

(30) Foreign Application Priority Data

Sep. 12, 2017    (KR) .................. 10-2017-0116704

(51) Int. Cl.
*G11C 5/14* (2006.01)
*G11C 11/4074* (2006.01)
*G11C 16/12* (2006.01)
*G11C 16/30* (2006.01)

(52) U.S. Cl.
CPC .......... *G11C 5/147* (2013.01); *G11C 11/4074* (2013.01); *G11C 16/12* (2013.01); *G11C 16/30* (2013.01); *G11C 2207/2227* (2013.01)

(58) Field of Classification Search
CPC ............................................. G11C 11/4074
USPC .................................... 365/189.11
See application file for complete search history.

(56) References Cited

U.S. PATENT DOCUMENTS

| | | | | |
|---|---|---|---|---|
| 2005/0007851 A1* | 1/2005 | Takahashi | ............... | G11C 7/20 365/222 |
| 2005/0276110 A1* | 12/2005 | Sakurai | ................. | G11C 5/147 365/185.18 |
| 2013/0250704 A1* | 9/2013 | Furutani | ............ | H03K 19/0013 365/189.11 |
| 2015/0179249 A1* | 6/2015 | Park | ................. | G11C 11/40615 365/207 |
| 2015/0364166 A1* | 12/2015 | Im | ........................... | G11C 7/12 365/189.11 |

FOREIGN PATENT DOCUMENTS

KR    1020030025323    3/2003

* cited by examiner

*Primary Examiner* — Min Huang
(74) *Attorney, Agent, or Firm* — IP & T Group LLP

(57) ABSTRACT

There are provided a memory system and a method for operating the same. A memory system includes: a controller configured to generate and output a first command corresponding to a normal operation or a second command corresponding to a deep power down (DPD) mode; and a semiconductor memory device configured to perform the normal operation in response to the first command, wherein the normal operation is performed using an internal power voltage generated by down-converting a first external power voltage, and operate in the DPD mode in response to the second command, wherein, in the DPD mode, the semiconductor memory device operates using a second external power voltage as the internal powervoltage.

16 Claims, 8 Drawing Sheets

MEMORY SYSTEM AND METHOD FOR OPERATING THE SAME

CROSS-REFERENCE TO RELATED APPLICATION

The present application claims priority under 35 U.S.C. § 119(a) to Korean patent application number 10-2017-0116704, filed on Sep. 12, 2017, which is incorporated herein by reference in its entirety.

BACKGROUND

1. Field

Exemplary embodiments of the present disclosure generally relate to a memory system including a nonvolatile memory device. Particularly, the embodiments relate to a memory system capable of reducing current consumption and a method for operating the memory system.

2. Description of the Related Art

The computer environment paradigm has recently been transitioning into ubiquitous computing, which enables computing systems to be used anywhere and anytime. As a result, use of portable electronic devices such as mobile phones, digital cameras, laptop computers, and the like has rapidly increased. Such portable electronic devices generally include a memory system using a memory device, i.e., a data storage device. The data storage device may be used as a main memory device or an auxiliary memory device of the portable electronic devices.

These memory systems provide excellent stability and durability, high information access speed, and low power consumption, since there is no mechanical driving part. Examples of memory systems having such advantages include a universal serial bus (USB) memory device, memory cards having various interfaces, a solid state drive (SSD), and the like.

SUMMARY

Embodiments provide a memory system capable of performing a normal operation with an internal power voltage down-converted from a first external power voltage and performing a standby mode operation with a second external power voltage in a deep power down (DPD) mode, and a method for operating the memory system.

According to an aspect of the present disclosure, there is provided a memory system including: a controller configured to generate and output a first command corresponding to a normal operation or a second command corresponding to a DPD mode; and a semiconductor memory device configured to perform the normal operation in response to the first command, wherein the normal operation is performed using an internal power voltage generated by down-converting a first external power voltage, and operate in the DPD mode in response to the second command, wherein, in the DPD mode, the semiconductor memory device operates using a second external power voltage as the internal power voltage.

According to an aspect of the present disclosure, there is provided a memory system including: a controller configured to generate and output a command corresponding to a normal operation in response to a request from a host; and a semiconductor memory device configured to perform the normal operation, using a first internal power voltage generated using a first external power voltage, and operate in a DPD mode, using a second internal power voltage generated using a second external power voltage having a potential level lower than that of the first external power voltage in the DPD mode.

According to an aspect of the present disclosure, there is provided a method for operating a memory system, the method including: generating a first internal power voltage, using a first external power voltage, in a normal operation; performing the normal operation, using the first internal power voltage; generating a second internal power voltage, using a second external power voltage, in a DPD mode; and operating in the DPD mode, using the second internal power voltage.

BRIEF DESCRIPTION OF THE DRAWINGS

Example embodiments will now be described in more detail hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure are shown and described, simply by way of illustration. As those skilled in the art will realize, the described embodiments may be modified in various different ways, without departing from the spirit or scope of the present disclosure. Accordingly, the drawings and description are to be regarded as illustrative in nature and not restrictive.

Throughout the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

As used herein, singular forms may include the plural forms as well, unless the context clearly indicates otherwise.

Hereinafter, the various embodiments of the present invention will be described in detail with reference to the attached drawings.

Figure 1:
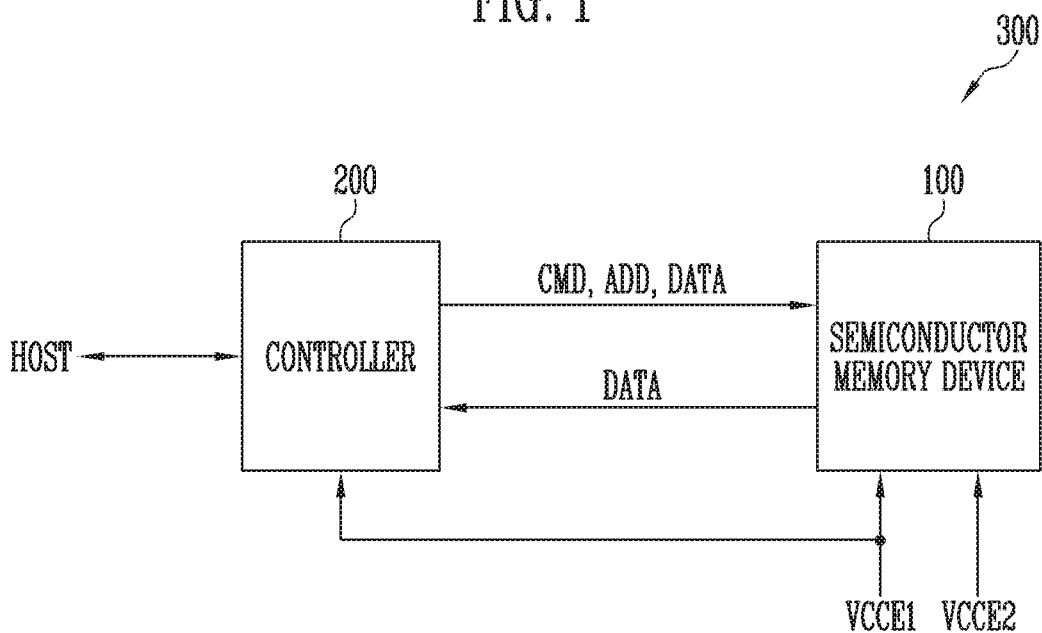
FIG. 1 is a block diagram illustrating a memory system according to an embodiment of the present disclosure.

FIG. 1 is a block diagram illustrating a memory system 300 according to an embodiment of the present disclosure.

Referring to FIG. 1, the memory system 300 may include a semiconductor memory device 100 and a controller 200 for controlling an operation of the semiconductor memory device 100 in response to a request from a host.

The semiconductor memory device 100 may perform a program operation or a read operation on memory cells of pages included in a memory block in response to a command CMD and an address ADD, which are received from the controller 200. The semiconductor memory device 100 programs data DATA input from the controller 200 to memory cells of a page to be programmed, and outputs data DATA read from the memory cells to the controller 200. Also, the semiconductor memory device 100 may perform an erase operation of erasing data stored in the memory block in response to a command CMD and an address ADD, which are received from the controller 200. Each of the above-described program, read, and erase operations may be defined as a 'normal operation' of the semiconductor memory device 100.

In addition, the semiconductor memory device 100 may operate in a deep power down (DPD) mode in response to a command CMD received from the controller.

The memory system 300 consumes lower power in the DPD mode than it does in a standby mode. For example, in the DPD mode, the memory system 300 turns off power applied to an internal circuit of the semiconductor memory device 100, and supplies power to only a control logic for operating the semiconductor memory device 100.

According to the embodiment of the present disclosure, in the normal operation of the semiconductor memory device 100, the memory system 300 operates using a first external power voltage VCCE1. When the semiconductor memory device 100 operates in the DPD mode, the memory system 300 operates using a second external power voltage VCCE2 having a potential level lower than that of the first external power voltage VCCE1. Accordingly, the current consumption amount of the memory system 300 can be decreased. In addition, when the memory system 300 operates in the DPD mode, the memory system 300 uses the second external power voltage VCCE2 as an internal power voltage without any down-converting operation. Accordingly, it is possible to prevent current consumption caused by the down-converting operation.

Figure 2:
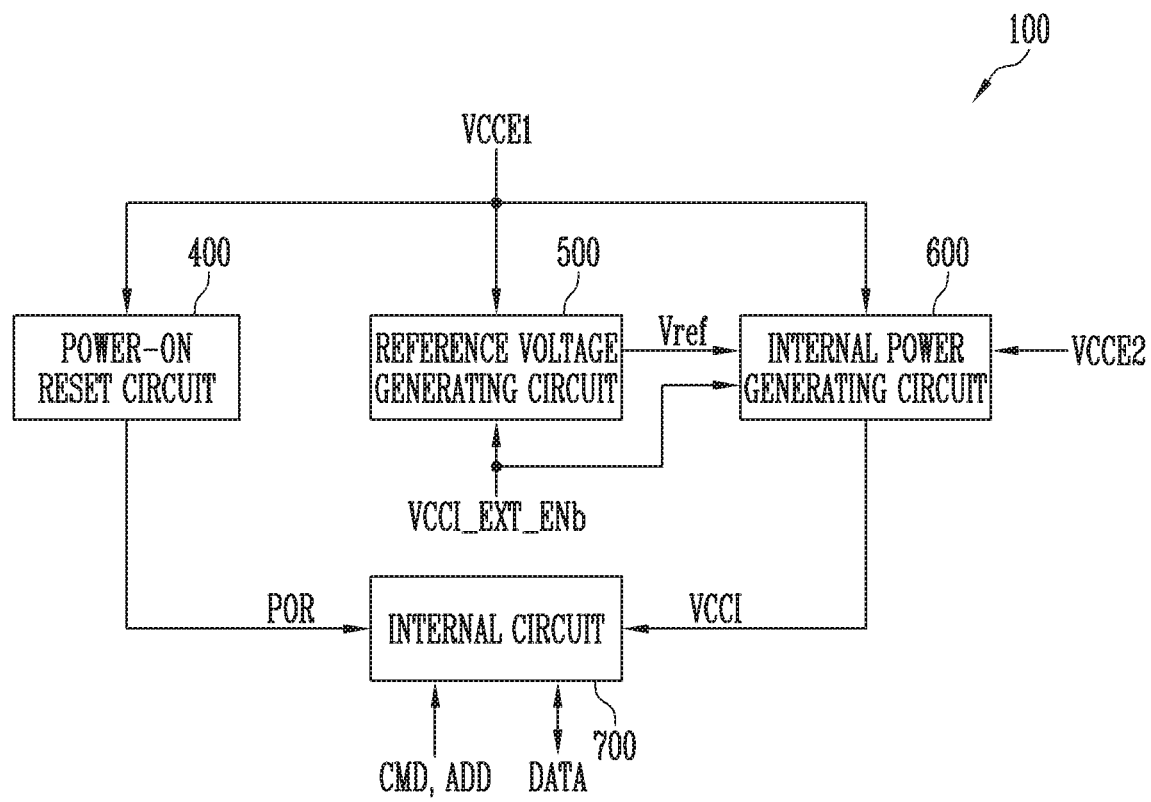
FIG. 2 is a block diagram illustrating a semiconductor memory device shown in FIG. 1.

FIG. 2 is a block diagram illustrating the semiconductor memory device 100 shown in FIG. 1.

Referring to FIG. 2, the semiconductor memory device 100 may include a power-on reset circuit 400, a reference voltage generating circuit 500, an internal power generating circuit 600, and an internal circuit 700.

The power-on reset circuit 400 generates and outputs a power-on reset signal POR by detecting a potential level of the first external power voltage VCCE1. For example, when the potential level of the first external power voltage VCCE1 is increased to a set level or higher in a power-on operation of the memory system, the power-on reset circuit 400 generates and outputs a toggling power-on reset signal POR.

The reference voltage generating circuit 500 receives the first external power voltage VCCE1 applied in the normal operation of the semiconductor memory device 100 to generate and output a reference voltage Vref having a certain level. Also, the reference voltage generating circuit 500 is disabled in response to an enable signal VCCI_EXT_ENb in the DPD mode of the semiconductor memory device 100 to prevent power consumption. The enable signal VCCI_EXT_ENb is enabled to a low level when the DPD mode is enabled, and activates an operation of generating the second external power voltage VCCE2 as an internal power voltage VCCI.

The internal power generating circuit 600 generates and outputs the internal power voltage VCCI, using the first external power voltage VCCE1 and the reference voltage Vref output from the reference voltage generating circuit 500 in the normal operation of the semiconductor memory device 100. That is, the internal power generating circuit 600 generates and outputs the internal power voltage VCC1 by down-converting the first external power voltage VCCE1 in the normal operation of the semiconductor memory device 100.

Also, the internal power generating circuit 600 may output, as the internal power voltage VCCI, the second external power voltage VCCE2 having a potential level lower than that of the first external power voltage VCCE1, in response to the enable signal VCCI_EXT_ENb in the DPD mode of the semiconductor memory device 100, without any down-converting operation.

For example, the first external power voltage VCCE1 may be 3.3 V, and the second external power voltage VCCE2 may be 1.8 V. In addition, the potential level of the internal power voltage VCCI generated from the first external power voltage VCCE1 in the normal operation may be higher than that of the internal power voltage VCCI, which is the second external power voltage VCCE2, in the DPD mode.

The internal circuit 700 is initialized in response to the power-on reset signal POR output from the power-on reset circuit 400 in the power-on operation. Also, in the normal operation of the semiconductor memory device 100, the internal circuit 700 may perform a program operation of programming data DATA to memory cells of pages included in a memory block in response to a command CMD and an address ADD, which are received from the controller 200 of FIG. 1, or a read operation of reading and outputting data DATA stored in the memory cells, or perform an erase operation of erasing data DATA stored in memory cells in response to a command CMD and an address.

In the normal operation such as the program operation, the read operation, or the erase operation, the internal circuit 700 operates by being supplied with the internal power voltage VCCI, which is down-converted from the first external power voltage VCCE1. In the DPD mode of the semiconductor memory device 100, the internal circuit 700 operates by being supplied with the internal power voltage VCCI, which is the second external power voltage VCCE2. As described above, the internal power voltage VCCI is a power voltage for the internal circuit 700.

As described above, according to the embodiment of the present disclosure, in the DPD mode of the semiconductor memory device 100, the internal power generating circuit 600 outputs the second external power voltage VCCE2 as the internal power voltage VCCI without any down-converting operation. Accordingly, it is possible to prevent current consumption caused by the down-converting operation.

Figure 3:
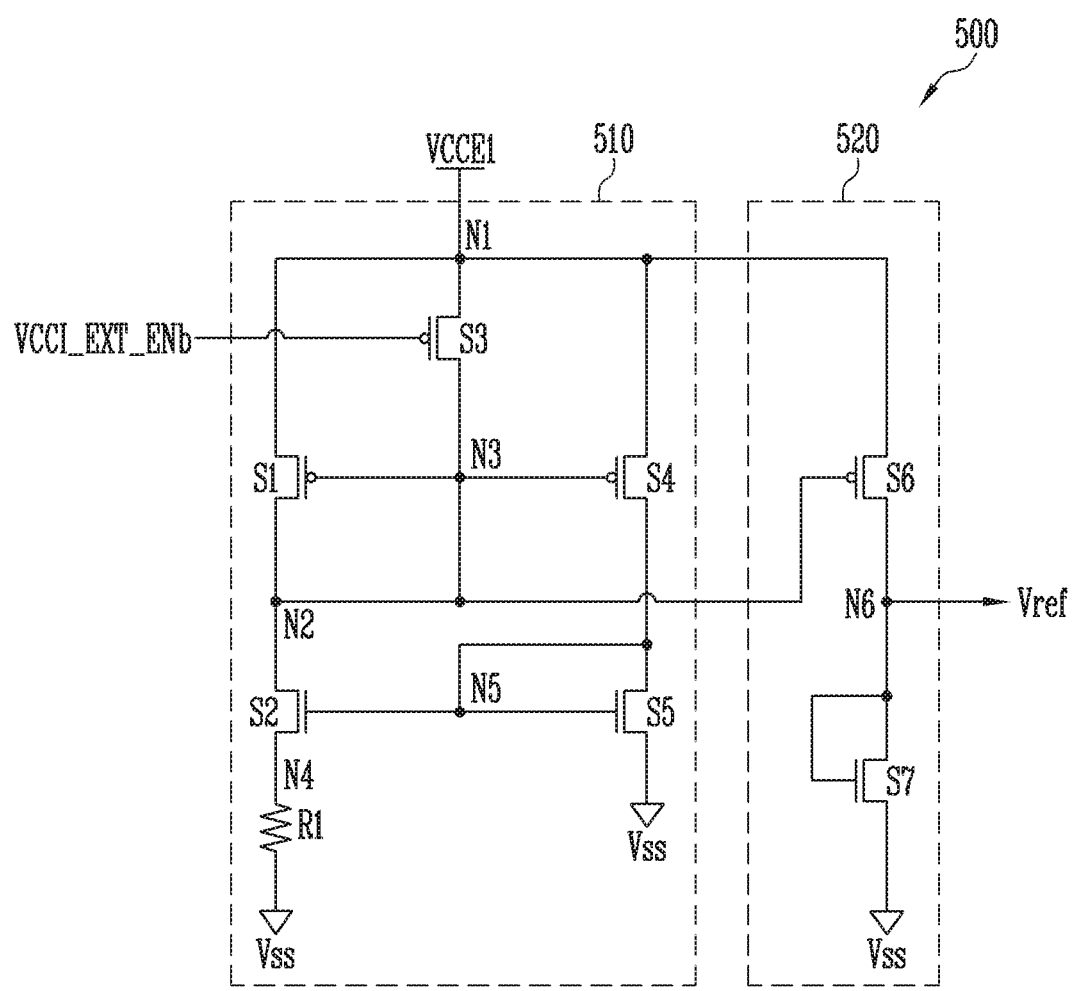
FIG. 3 is a circuit diagram illustrating a reference voltage generating circuit shown in FIG. 2.

FIG. 3 is a circuit diagram illustrating the reference voltage generating circuit 500 shown in FIG. 2.

Referring to FIG. 3, the reference voltage generating circuit 500 may include a mirroring circuit 510 and a voltage generator 520.

The mirroring circuit 510 is coupled between a first node N1 to which the first external power voltage VCCE1 is applied and a ground terminal Vss. The mirroring circuit 510 generates a constant sub-voltage. Also, the mirroring circuit 510 may be enabled or disabled in response to the enable signal VCCI_EXT_ENb. For example, the mirroring circuit 510 may be configured with first to fifth switches S1 to S5 and a first resistor R1.

The first switch S1 is coupled between the first node N1 and a second node N2, and may be implemented with a PMOS transistor in which a channel is formed in response to a potential of a third node N3. The initial value of each of the second node N2 and the third node N3 is set to low. The second switch S2 is coupled between the second node N2 and a fourth node N4, and may be implemented with an NMOS transistor in which a channel is formed in response to a potential of a fifth node N5. The first resistor R1 is coupled between the fourth node N4 and the ground terminal Vss. The third switch S3 is coupled between the first node N1 and the third node N3, and may be implemented with a PMOS transistor in which a channel is formed in response to the enable signal VCCI_EXT_ENb. The fourth switch S4 is coupled between the first node N1 and the fifth node N5, and may be implemented with a PMOS transistor in which a channel is formed in response to a potential of the third node N3. The fifth switch S5 is coupled between the fifth node N5 and the ground terminal Vss, and may be implemented with an NMOS transistor in which a channel is formed in response to a potential of the fifth node N5.

The voltage generator 520 may include a sixth switch S6 and a seventh switch S7. The sixth switch S6 is coupled between the first node N1 and a sixth node N6, and may be implemented with a PMOS transistor in which a channel is formed in response to a potential of the second node N2. The seventh switch S7 is coupled between the sixth node N6 and the ground terminal Vss, and may be implemented with an NMOS transistor in which a channel is formed in response to a potential of the sixth node N6.

An operation of the reference voltage generating circuit 500 is as follows.

In the normal operation of the semiconductor memory device, the third switch S3 is turned off in response to the enable signal VCCI_ENb having a high level. Accordingly, the initial voltage of the third node N3 maintains a low voltage, and a certain current flows through the first and fourth switches S1 and S4. Thus, voltages obtained by dividing the first external power voltage VCCE1 are transferred to the second node N2 and the fifth node N5, respectively. Since a positive voltage lower than the first external power voltage VCCE1 is applied to the fifth node N5, a current path passing through the first node N1, the second node N2, the second switch S2, the fourth node N4, the first resistor R1, and the ground terminal Vss is formed by the channel formed in the second switch S2, and a current path passing through the first node N1, the fourth switch S4, the fifth node N5, the fifth switch S5, and the ground terminal Vss is formed by the channel in the fifth switch S5. Since the first, second, fourth, and fifth switches S1, S2, S4, and S5 are coupled in a current mirror form, a constant sub-voltage is applied to the second node N2.

The sixth switch S6 of the voltage generator 520 supplies a constant current to the sixth node N6 in response to the sub-voltage having a constant potential level. The sixth node N6 outputs the reference voltage Vref by maintaining a constant potential level according to a threshold voltage value of the seventh switch S7.

In the DPD mode of the semiconductor memory device, the third switch S3 is turned on in response to the enable signal VCCI_EXT_ENb having a low level. Accordingly, the potential level of the third node N3 maintains a high level, so that the first to fourth switches S1 and S4 maintain a turn-off state. Thus, the mirroring circuit 510 is disabled as the supply of the first external power voltage VCCE1 is cut off.

In addition, the sixth switch S6 of the voltage generator 520 is turned off according to the potential level of the third node N3, which is a high level. Accordingly, the voltage generator 520 is disabled as the supply of the first external power voltage VCCE1 is cut off.

Figure 4:
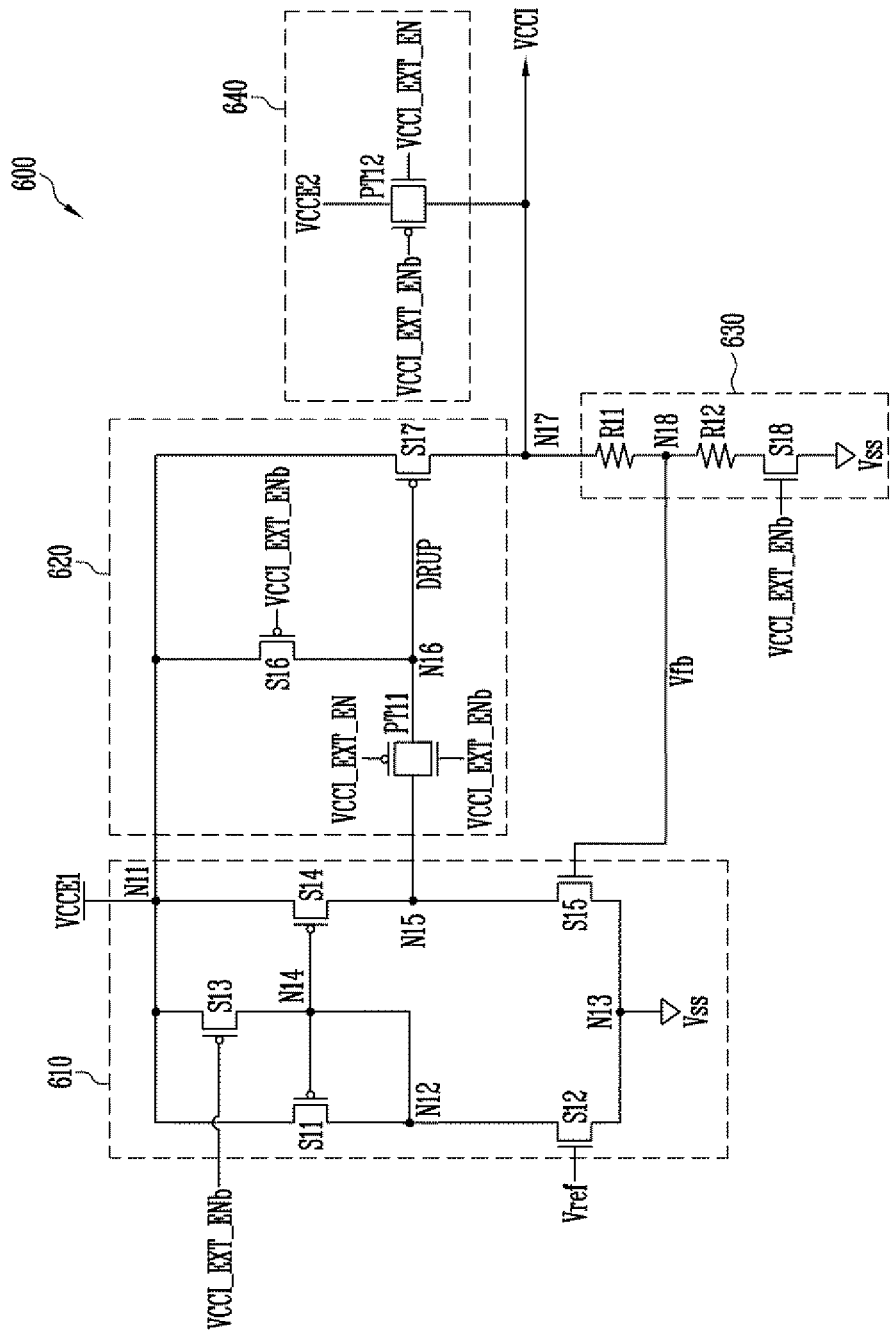
FIG. 4 is a circuit diagram illustrating an internal power generating circuit shown in FIG. 2.

FIG. 4 is a circuit diagram illustrating the internal power generating circuit 600 shown in FIG. 2.

Referring to FIG. 4, the internal power generating circuit 600 may include a mirroring circuit 610, an output circuit 620, a feedback voltage generating circuit 630, and a voltage switching circuit 640.

The mirroring circuit 610 is coupled between a first node N11 to which the first external power voltage VCCE1 is applied and a ground terminal Vss. The mirroring circuit 610 generates a constant internal voltage. Also, the mirroring circuit 610 may be enabled or disabled in response to the enable signal VCCI_EXT_ENb. For example, the mirroring circuit 610 may be configured to include first to fifth switches S11 to S15.

The first switch S11 is coupled between the first node N11 and a second node N12, and may be implemented with a PMOS transistor in which a channel is formed in response to a potential of a fourth node N14. The initial value of each of the second node N12 and the fourth node N14 is set to low. The second switch S12 is coupled between the second node N12 and a third node N13, and may be implemented with an NMOS transistor in which a channel is formed in response to the potential of the reference voltage Vref output from the reference voltage generating circuit 500. The third node N13 is coupled to the ground terminal Vss. The third switch N13 is coupled between the first node N11 and the fourth node N14, and may be implemented with a PMOS transistor in which a channel is formed in response to the enable signal VCCI_EXT_ENb. The fourth switch S14 is coupled between the first node N11 and a fifth node N15, and may be implemented with a PMOS transistor in which a channel is formed in response to a potential of the fourth node N14. The fifth switch S15 is coupled between the fifth node N15 and the third node N13, and may be implemented with an NMOS transistor in which a channel is formed in response to a feedback voltage Vfb.

The output circuit 620 is coupled between the fifth node N15 and a seventh node N17 that is an output node. The output circuit 620 generates and outputs the internal power voltage VCCI by down-converting the first external power voltage VCCE1 in the normal operation of the semiconductor memory device.

The output circuit 620 may include a first pass transistor PT11 and sixth and seventh switches S16 and S17.

The first pass transistor PT11 is coupled between the fifth node N15 and a sixth node N16 to transmit an internal voltage DRUP to the sixth node N16 in response to the enable signal VCCI_EXT_ENb and a sub-enable signal VCCI_EXT_EN having an inversion relationship with the enable signal VCCI_EXT_ENb. The sixth switch S16 is coupled between the first node N11 and the sixth node N16, and may be implemented with a PMOS transistor in which a channel is formed in response to the enable signal VCCI_EXT_ENb. The seventh switch S17 is coupled between the first node N11 and the seventh node N17, and may be implemented with a PMOS transistor in which a channel is formed in response to the internal voltage DRUP. The seventh switch S17 transmits, to the seventh node N17, a voltage generated by down-converting the first external power voltage VCCE1 input through the first node N11 in response to the internal voltage DRUP.

The feedback voltage generating circuit 630 is coupled between the seventh node N17 that is the output node and the ground terminal Vss. The feedback voltage generating circuit 630 generates and outputs the feedback voltage Vfb. Also, the feedback voltage generating circuit 630 may be enabled or disabled in response to the enable signal VCCI_EXT_ENb.

The feedback voltage generating circuit 630 may include a first resistor R11, a second resistor R12, and an eighth switch S18, which are coupled in series between the seventh node N17 and the ground terminal Vss. The first resistor R11 and the second resistor R12 output the feedback voltage Vfb through an eighth node N18 between the first resistor R11 and the second resistor R12 by dividing the potential level of the seventh node N17, i.e., the internal power voltage VCCI according to a resistance ratio thereof. The eighth switch S18 is coupled between the second resistor R12 and the ground terminal Vss, and may be implemented with an NMOS transistor in which a channel is formed in response to the enable signal VCCI_EXT_ENb.

The voltage switching circuit 640 is coupled to the seventh node N17 that is the output node. The voltage switching circuit 640 outputs one of the second external power voltage VCCE2 and a voltage, which is down-converted from the first external power voltage VCCE1 by the output circuit 620, as the internal power voltage VCCI in response to the enable signal VCCI_EXT_ENb and the sub-enable signal enable signal VCCI_EXT_EN. The voltage switching circuit 640 may include a second pass transistor PT12.

An operation of the internal power generating circuit 600 is as follows.

In the normal operation of the semiconductor memory device, the third switch S13 is turned off in response to the enable signal VCCI_EXT_ENb having a high level. Accordingly, the initial voltage of the fourth node N14 maintains a low voltage, and a constant current flows through the first and fourth switches S11 and S14. Thus, voltages obtained by dividing the first external power voltage VCCE1 are transferred to the second node N12 and the fifth node N15, respectively. A channel is formed in the second switch S12 by the reference voltage Vref having a constant potential level. Accordingly, the second node N12 can maintain a constant potential level.

A channel in the fifth switch S15 is controlled in response to the feedback voltage Vfb, and accordingly, the potential level of the fifth node N15 is controlled, so that the internal voltage DRUP is output. That is, the mirroring circuit 610 generates and outputs the internal voltage DRUP controlled according to a difference in potential level between the reference voltage Vref and the feedback voltage Vfb.

The first pass transistor PT11 of the output circuit 620 may transmit the internal voltage DRUP to the sixth node N16 in response to the enable signal VCCI_EXT_ENb and the sub-enable signal VCCI_EXT_EN. The seventh switch S17 transmits, to the seventh node N17, a voltage generated by down-converting the first external power voltage VCCE1 input through the first node N11 in response to the internal voltage DRUP.

The voltage switching circuit 640 cuts off the second external power voltage VCCE2 in response to the enable signal VCCI_EXT_ENb and the sub-enable signal VCCI_EXT_EN, and outputs the potential level of the seventh node N17 as the internal power voltage VCCI.

The feedback voltage generating circuit 630 generates the feedback voltage Vfb by dividing the potential of the seventh node N17 and outputs the generated feedback voltage Vfb to the mirroring circuit 610. When the potential of the seventh node N17, i.e., the internal power voltage VCCI is higher than a set value, the feedback voltage Vfb is increased. Accordingly, the amount of current discharged through the fifth switch S15 of the mirroring circuit 610 is increased, and thus the potential level of the fifth node N15 is increased. Accordingly, as the potential level of the internal voltage DRUP is increased, the amount of current supplied through the seventh switch S17, and the potential level of the seventh node N17 is decreased, so that the internal power voltage VCCI is decreased.

When the internal power voltage VCCI is lower than the set value, the feedback voltage Vfb is decreased. Accordingly, the amount of current discharged through the fifth switch S15 of the mirroring circuit 610 is decreased, and thus the potential level of the fifth node N15 is decreased. Accordingly, as the potential level of the internal voltage DRUP is decreased, the amount of current supplied through the seventh switch S17 is increased, and the potential level of the seventh node N17 is increased, so that the internal power voltage VCCI is increased.

In the DPD operation of the semiconductor memory device, the third switch S13 of the mirroring circuit 610 is turned on in response to the enable signal VCCI_EXT_ENb having a low level. Accordingly, the potential level of the third node N13 maintains a high level, so that the first and fourth switches S11 and S14 maintain the turn-off state. Thus, the mirroring circuit 610 is disabled as the supply of the first external power voltage VCCE1 is cut off.

In addition, the first pass transistor PT11 is turned off in response to the enable signal VCCI_EXT_ENb having a low level and the sub-enable signal VCCI_EXT_EN having a high level. In addition, as the sixth switch S16 applies the first external power voltage VCCE1 to the sixth node N16 in response to the enable signal VCCI_EXT_ENb having the low level, the seventh switch S17 is turned off. Accordingly, the down-converting operation is stopped.

The eighth switch S18 of the feedback voltage generating circuit 630 is turned off in response to the enable signal VCCI_EXT_ENb having the low level, so that the feedback voltage generating circuit 630 is disabled.

The voltage switching circuit 640 outputs the second external power voltage VCCE2 as the internal power voltage VCCI by applying the second external power voltage VCCE2 to the seventh node N17 in response to the enable signal VCCI_EXT_ENb having the low level and the sub-enable signal VCCI_EXT_EN having the high level.

As described above, according to the embodiment of the present disclosure, in the normal operation of the semiconductor memory device, the internal power generating circuit 600 outputs a voltage, which is down-converted from the first external power voltage VCCE1, as the internal power voltage VCCI. In the DPD mode of the semiconductor memory device, the internal power generating circuit 600 cuts off the first external power voltage VCCE1 and outputs the second external power voltage VCCE2 as the internal power voltage VCCI without any down-converting operation. Accordingly, current consumption caused by the down-converting operation can be reduced.

Figure 5:
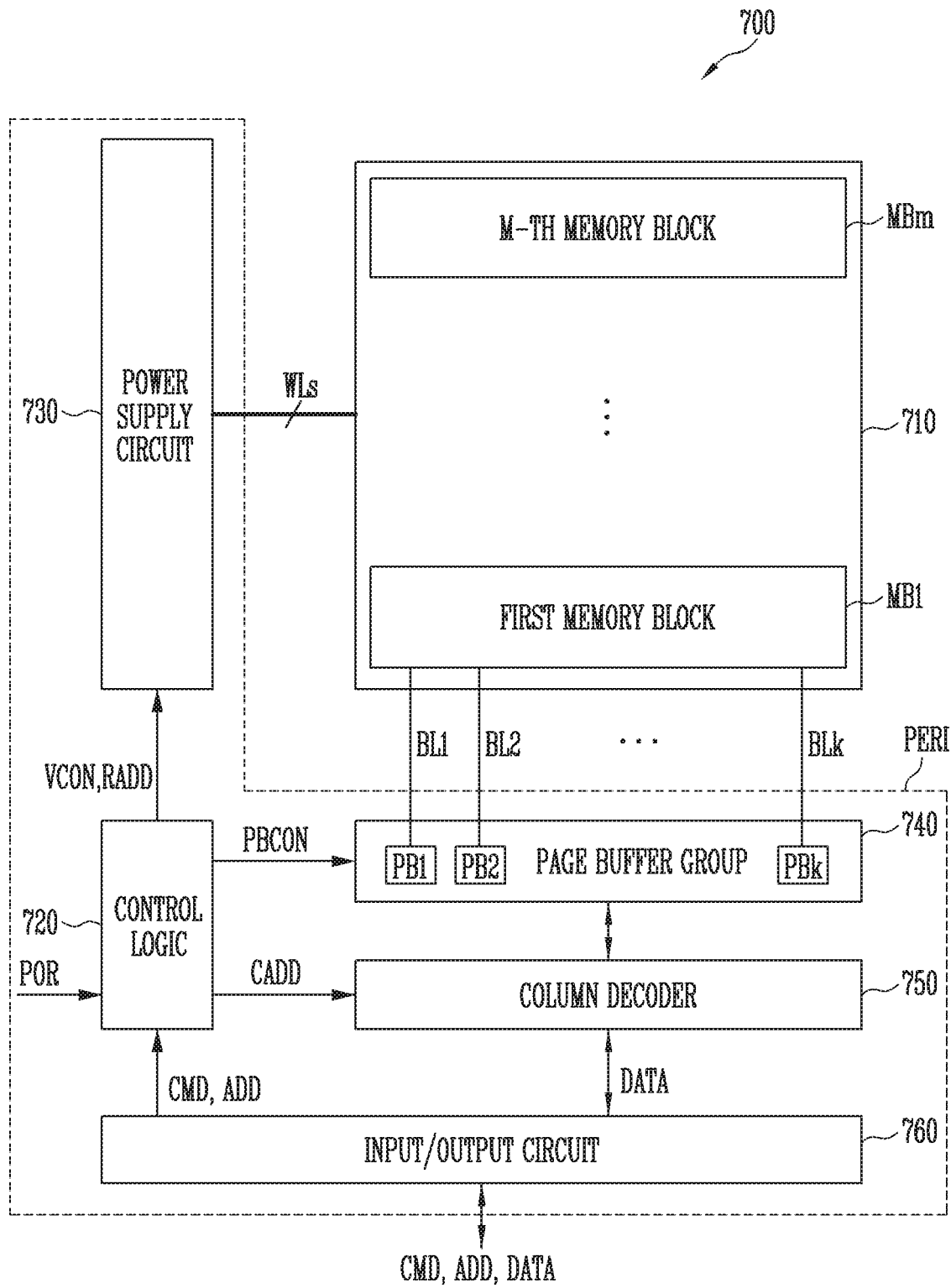
FIG. 5 is a block diagram illustrating an internal circuit shown in FIG. 2.
Figure 6:
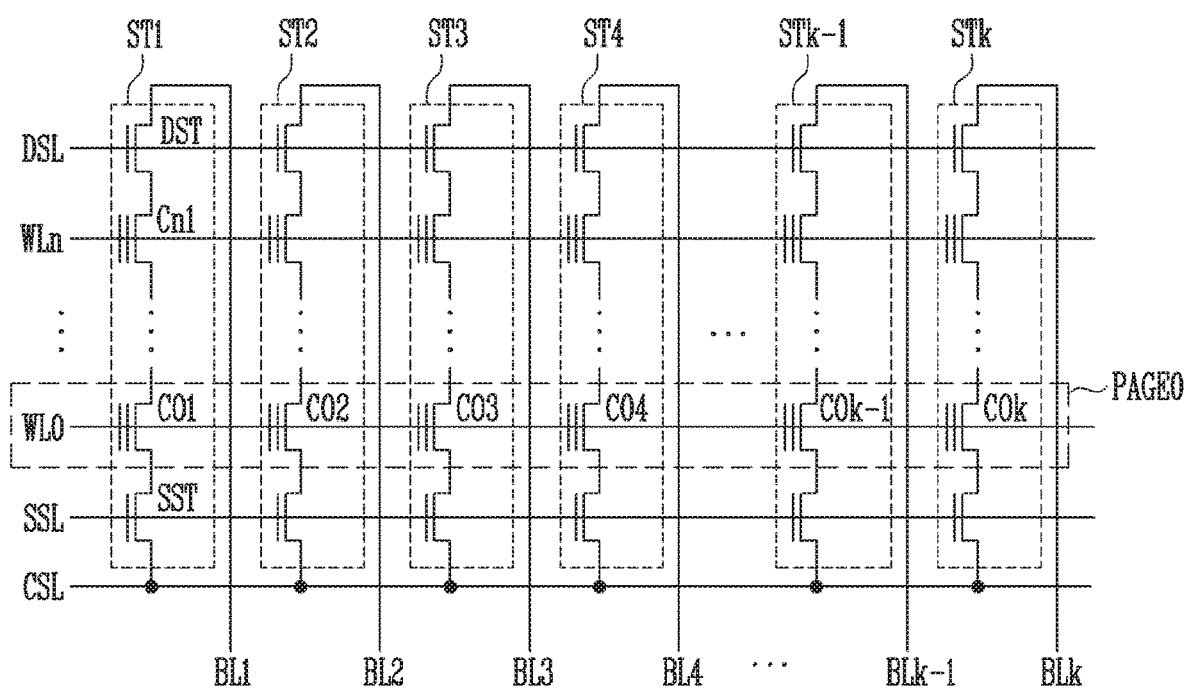
FIG. 6 is a circuit diagram illustrating a memory block shown in FIG. 5.

FIG. 5 is a block diagram illustrating the internal circuit 700 shown in FIG. 2. FIG. 6 is a circuit diagram illustrating a memory block shown in FIG. 5.

Referring to FIG. 5, the internal circuit 700 may include a memory cell array 710 including first to mth memory blocks MB1 to MBm and a peripheral circuit PERI configured to perform a program operation and a read operation on memory cells included in a selected page of the memory blocks MB1 to MBm. The peripheral circuit PERI may include a control logic 720, a power supply circuit 730, a page buffer group 740, a column decoder 750, and an input/output circuit 760.

Referring to FIG. 6, each memory block MB1 to Mbm may include a plurality of strings ST1 to STk coupled between bit lines BL1 to BLk and a common source line CSL. That is, the strings ST1 to STk are coupled to corresponding bit lines BL1 to BLk, respectively, and are commonly coupled to the common source line CSL. Each string ST1 may include a source select transistor SST having a source coupled to the common source line CSL, a plurality of memory cells C01 to Cn1, and a drain select transistor DST having a drain coupled to the bit line BL1. The memory cells C01 to Cn1 are coupled in series between the select transistors SST and DST. A gate of the source select transistor SST is coupled to a source select line SSL, gates of the memory cells C01 to Cn1 are coupled to word lines WL0 to WLn, respectively, and a gate of the drain select transistor DST is coupled to a drain select line DSL.

Memory cells included in a memory block may be divided in units of physical pages or logical pages. For example, the memory cells C01 to C0$k$ coupled to one word line (e.g., WL0) constitute one physical page PAGE0. Such a page becomes a basic unit of the program operation or the read operation.

The control logic 720 outputs a voltage control signal VCON for generating a voltage required to perform a program operation or a read operation in response to a command CMD input through the input/output circuit 760, and outputs a PB control signal PBCON for controlling page buffers PB1 to PBk included in the page buffer group 740 according to the kind of an operation. Also, the control logic 720 outputs a row address signal RADD and a column address signal CADD in response to an address signal ADD input externally through the input/output circuit 760.

The power supply circuit 730 supplies operating voltages required to perform a program operation, a read operation, and an erase operation on memory cells in response to the voltage control signal VCON of the control logic 720 to local lines including the drain select line DSL, the word lines WL0 to WLn, and the source select line SSL of a selected memory block. The power supply circuit 730 may include a voltage generating circuit and a row decoder.

The voltage generating circuit outputs operating voltages required to perform a program operation, a read operation, or an erase operation of memory cells to global lines in response to the voltage control signal VCON of the control logic 720.

The row decoder connects the global lines to the local lines DSL, WL0 to WLn, and SSL such that the operating voltages output to the global lines by the voltage generating circuit can be transferred to the local lines DSL, WL0 to WLn, and SSL of a selected memory block in the memory cell array 710.

The page buffer group 740 may include a plurality of page buffers PB1 to PBk coupled to the memory cell array 710 respectively through the bit lines BL1 to BLk. The page buffers PB1 to PBk of the page buffer group 740 selectively precharge the bit lines BL1 to BLk according to input data so as to store data in the memory cells C01 to C0$k$ in response to the PB control signal PBCON of the control logic 720, or sense voltages of the bit lines BL1 to BLk so as to read data from the memory cells C01 to C0$k$.

The column decoder 750 selects the page buffers PB1 to PBk included in the page buffer group 740 in response to the column address signal CADD output from the control logic 720. That is, the column decoder 750 sequentially transfers data to be stored in the memory cells to the page buffers PB1 to PBk in response to the column address signal CADD. In addition, the column decoder 740 sequentially selects the page buffers PB1 to PBk in response to the column address signal CADD such that data of the memory cells, which are latched to the page buffers PB1 to PBk in a read operation can be output to the outside.

The input/output circuit 760 transfers data to the column decoder 750 under the control of the control logic 720 to input, to the page buffer group 740, data input externally to be stored in the memory cells in a program operation. When the column decoder 750 transfers the data transferred from the input/output circuit 760 to the page buffers PB1 to PBk of the page buffer group 740, the page buffers PB1 to PBk may store the input data in latch circuits thereof. In a read operation, the input/output circuit 760 outputs data transferred from the page buffers PB1 to PBk of the page buffer group 740 through the column decoder 750.

According to the embodiment of the present disclosure, in the normal operation of the semiconductor memory device, the internal power generating circuit 600 of FIG. 2 outputs, as a power voltage, the internal power voltage VCCI generated by down-converting the first external power voltage VCCE1, and the internal circuit 700 is operated using the power voltage. Also, in the DPD mode of the semiconductor memory device, the internal power generating circuit 600 outputs the second external power voltage VCCE2 as the internal power voltage VCCI without any down-converting operation, and the internal circuit 700 is operated using the internal power voltage VCCI. In the DPD mode of the semiconductor memory device, the control logic 720 of the internal circuit 700 is operated by the internal power voltage VCCI, and the supply of the internal power voltage VCCI to the peripheral circuit PERI is cut off. Accordingly, current consumption can be decreased.

Figure 7:
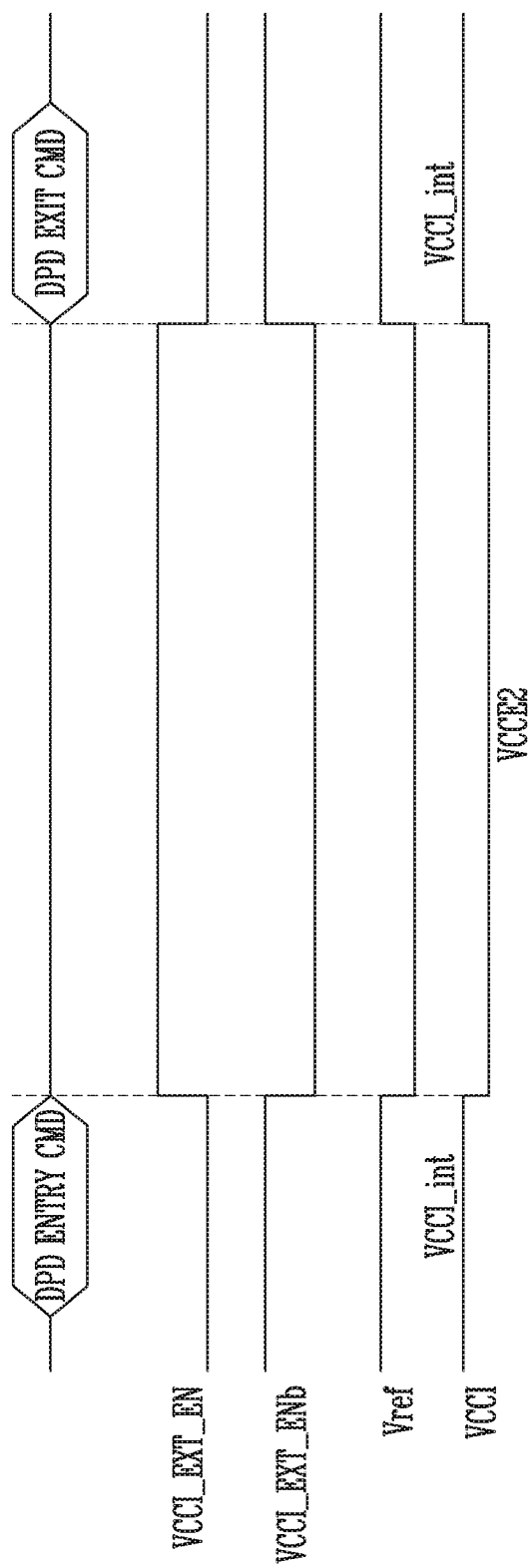
FIG. 7 is a waveform diagram of signals, illustrating an operation of the memory system according to the embodiment of the present disclosure.

FIG. 7 is a waveform diagram of signals, illustrating an operation of the memory system 300 according to the embodiment of the present disclosure.

An operation of the memory system 300 in the DPD mode according to the embodiment of the present disclosure will be described as follows with reference to FIGS. 1 to 7.

The controller 200 generates and outputs a command DPD ENTRY CMD requesting the memory device 100 to enter into the DPD mode in response to a request of the host.

The semiconductor memory device 100 generates the enable signal VCCI_EXT_ENb enabled at a low level and the sub-enable signal VCCI_EXT_EN enabled at a high level in response to the command DPD ENTRY CMD.

The reference voltage generating circuit 500 of the semiconductor memory device 100 is disabled in response to the enable signal VCCI_EXT_ENb having the low level to output the reference voltage Vref at a low level.

The internal power generating circuit 600 of the semiconductor memory device 100 initially (i.e., in the normal operation of the semiconductor memory device before the command DPD ENTRY CMD) outputs a first level VCCI_int, which is down-converted the first external power voltage VCCE1. The internal power generating circuit 600 of the semiconductor memory device 100 outputs the second external power voltage VCCE2 as the internal power voltage VCCI. Accordingly, the internal power voltage VCCI is changed from the first level VCCI_int, which is down-converted from the first external power voltage VCCE1 in the normal operation of the semiconductor memory device, to the second external power voltage VCCE2 in the DPD mode.

In the DPD mode, the control logic 720 of the internal circuit 700 may be operated in the standby mode, using the internal power voltage VCCI, and the supply of the internal power voltage VCCI to the other peripheral circuits, e.g., the power supply circuit 730, the page buffer group 740, the column decoder 750, and the input/output circuit 760 is cut off, so that current consumption may be minimized.

After, when the operation of the semiconductor memory device 100 is changed from the DPD mode to the normal operation, the controller 200 generates and outputs a command DPD EXIT CMD for ending the DPD mode, and the semiconductor memory device 100 generates the enable signal VCCI_EXT_ENb disabled at the high level and the sub-enable signal VCCI_EXT_EN disabled at the low level in response to the command DPD EXIT CMD.

Accordingly, the reference voltage generating circuit 500 generates the reference voltage Vref having a constant potential level, and the internal power generating circuit 600 generates and outputs the internal power voltage VCCI by down-converting the first external power voltage in response to the enable signal VCCI_EXT_ENb having the high level and the sub-enable signal VCCI_EXT_EN having the low level.

The internal circuit 700 performs the normal operation of the semiconductor memory device, using the internal power voltage VCCI as a power voltage.

As described above, according to the embodiment of the present disclosure, in the DPD mode of the semiconductor memory device 100, the internal power generating circuit 600 outputs the second external power voltage VCCE2 as the internal power voltage VCCI without any down-converting operation. Accordingly, current consumption caused by the down-converting operation can be prevented.

Figure 8:
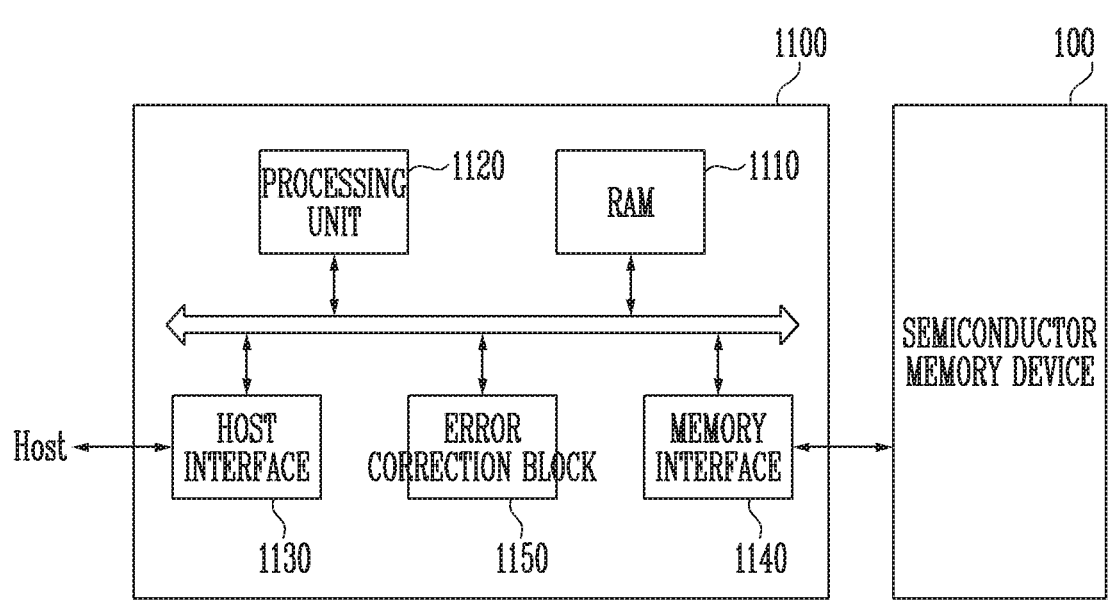
FIG. 8 is a block diagram illustrating another embodiment of the memory system.

FIG. 8 is a block diagram illustrating an embodiment of the memory system 1000.

Referring to FIG. 8, the memory system 1000 may include a semiconductor memory device 100 and the controller 1100.

The semiconductor memory device 100 may be configured and operate substantially identical to the semiconductor memory device described with reference to FIG. 1. Therefore, overlapping descriptions will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls overall operations of the controller 1100.

The host interface 1130 includes a protocol for exchanging data between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processing unit 1120 may control the semiconductor memory device 100 to adjust a read voltage, based on an error detection result of the error correction block 1150, and to perform re-reading. In an exemplary embodiment, the error correction block 1150 may be provided as a component of the controller 1100.

The controller 1100 and the semiconductor memory device 100 may be integrated into one semiconductor device. In an exemplary embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSCP), thin small outline package (TSOP), thin quad flat pack (TQFP), system in package (SIP), multi chip package (MCP), wafer-level fabricated package (WFP), or wafer-level processed stack package (WSP).

Figure 9:
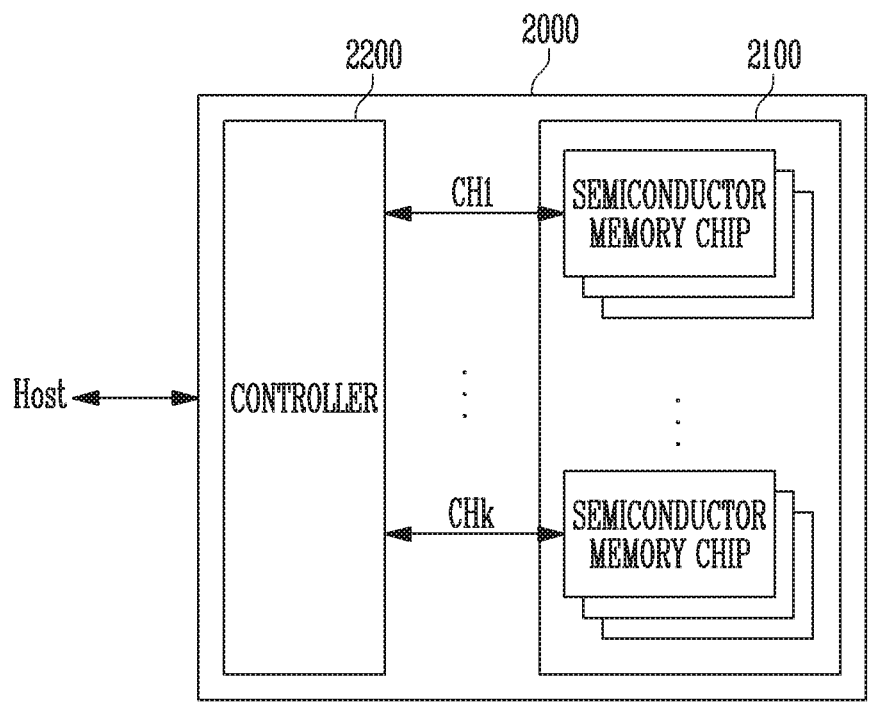
FIG. 9 is a block diagram illustrating an application example of the memory system of FIG. 8.

FIG. 9 is a block diagram illustrating an application example of the memory system 1000 of FIG. 8.

Referring to FIG. 9, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 9, it is illustrated that the plurality of groups communicate with the controller 2200 through first to kth channels CH1 to CHk. Each semiconductor memory chip may be configured and operated identically to the semiconductor memory device 100 described with reference to FIG. 1.

Each group is configured to communicate with the controller 2200 through one common channel. The controller 2200 is configured similarly to the controller 1100 described with reference to FIG. 8. The controller 2200 is configured to control the plurality of memory chips of the semiconductor memory device 2100 through the plurality of channels CH1 to CHk.

Figure 10:
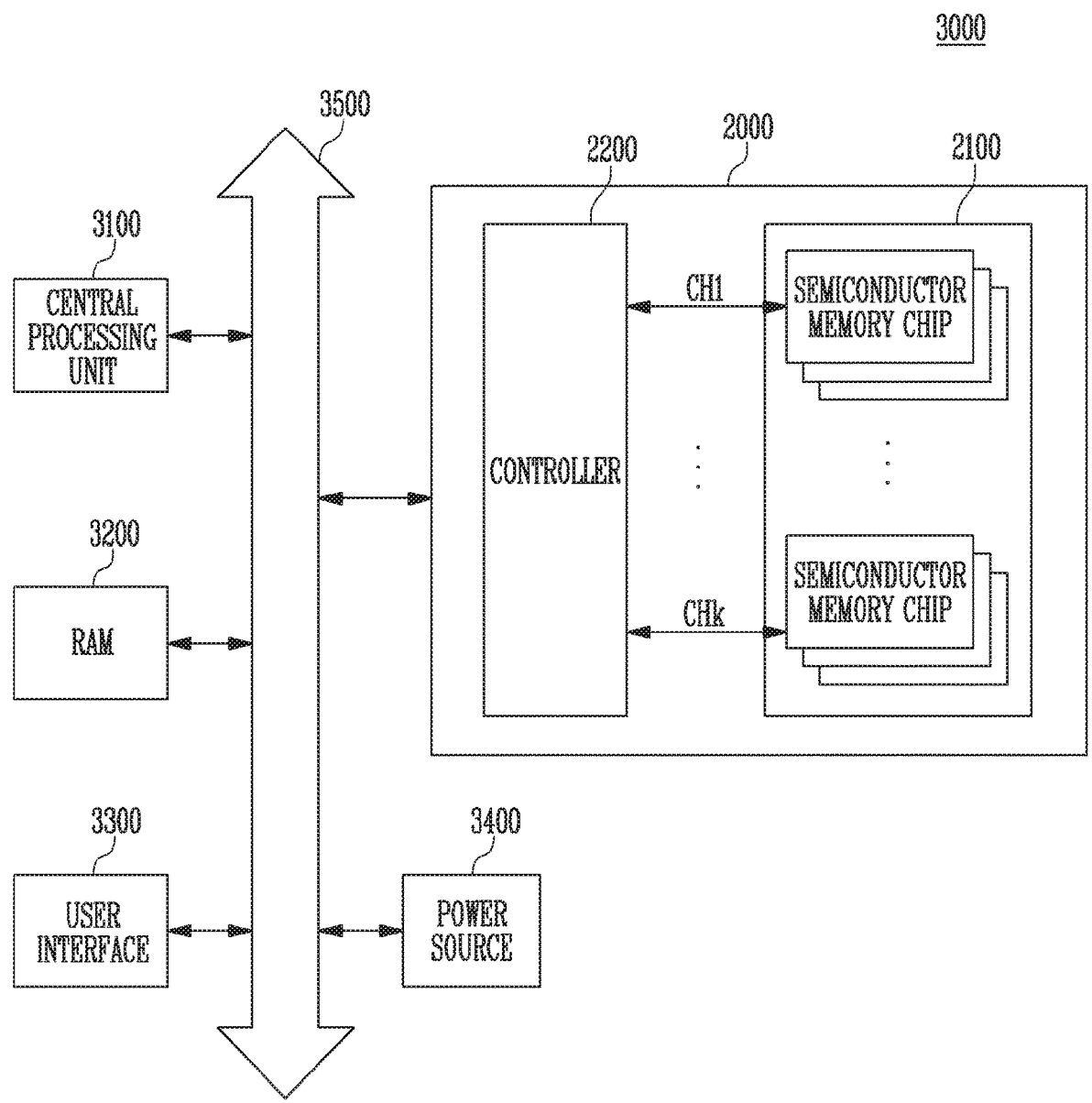
FIG. 10 is a block diagram illustrating a computing system including the memory system described with reference to FIG. 9.

FIG. 10 is a block diagram illustrating a computing system 3000 including the memory system described with reference to FIG. 9.

Referring to FIG. 10, the computing system 3000 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 10, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 10, it is illustrated that the memory system 2000 described with reference to FIG. 9 is provided. However, the memory system 2000 may be replaced by the memory system 1000 described with reference to FIG. 8. In an exemplary embodiment, the computing system 3000 may be configured to include both the memory systems 1000 and 2000 described with reference to FIGS. 8 and 9.

According to the present disclosure, the DPD mode of the memory system is performed using the second external power voltage lower than the first external power voltage used in the normal operation of the memory system, so that current consumption of the memory system can be minimized.

Example embodiments have been disclosed herein, and although specific terms are employed, they are used and are to be is interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
    a controller configured to generate and output a first command corresponding to a normal operation or a second command corresponding to a deep power down (DPD) mode; and
    a semiconductor memory device configured to perform the normal operation in response to the first command, wherein the normal operation is performed using an internal power voltage generated by down-converting a first external power voltage, and operate in the DPD mode in response to the second command, wherein, in the DPD mode, the semiconductor memory device operates using a second external power voltage as the internal power voltage,
    wherein the semiconductor memory device includes an internal power generating circuit configured to generate the internal power voltage, and
    wherein the internal power generating circuit includes:
    a feedback voltage generating circuit configured to generate a feedback voltage by dividing the internal power voltage in response to an enable signal; and
    an output circuit configured to receive an internal voltage controlled by a voltage difference between a reference voltage and the feedback voltage, and to generate the internal power voltage by controlling a current amount of the first external power voltage according to a potential level of the internal voltage in response to the enable signal.

2. The memory system of claim 1, wherein the second external power voltage has a potential level lower than that of the first external power voltage.

3. The memory system of claim 1, wherein the semiconductor memory device includes:
    the internal power generating circuit configured to generate the internal power voltage; and
    an internal circuit configured to perform the normal operation.

4. The memory system of claim 1, wherein the internal power generating circuit includes:
    a mirroring circuit enabled in response to the enable signal, the mirroring circuit being supplied with the first external power voltage, the mirroring circuit outputting the internal voltage controlled based on a difference in potential level between the reference voltage and the feedback voltage; and a voltage switching circuit configured to switch the second external power voltage to the internal power voltage in response to the enable signal.

5. The memory system of claim 1, wherein the enable signal is enabled in the DPD mode, and is disabled in the normal operation.

6. The memory system of claim 1, wherein, in the normal operation, the output circuit generates the internal power voltage by down-converting the first external power voltage in response to the internal voltage.

7. The memory system of claim 1, wherein, in the DPD mode, the output circuit cuts off the first external power voltage applied to an output node, and outputs the second external power voltage as the internal power voltage by supplying the second external power voltage to the output node.

8. The memory system of claim 4, wherein the mirroring circuit, the output circuit, and the feedback voltage generating circuit are disabled in the DPD mode.

9. The memory system of claim 1, further comprising a reference voltage generating circuit configured to generate the reference voltage, using the first external power voltage, in the normal operation.

10. The memory system of claim 9, wherein the reference voltage generating circuit is disabled in response to the enable signal enabled in the DPD mode.

11. A memory system comprising:
a controller configured to generate and output a command corresponding to a normal operation in response to a request from a host; and
a semiconductor memory device configured to perform the normal operation, using a first internal power voltage generated using a first external power voltage, and operate in a DPD mode, using a second internal power voltage generated using a second external power voltage having a potential level lower than that of the first external power voltage in the DPD mode, wherein the semiconductor memory device includes an internal power generating circuit configured to generate the first or second internal power voltage, and wherein the internal power generating circuit includes:
a feedback voltage generating circuit configured to generate a feedback voltage by dividing the first internal power voltage in response to an enable signal; and
an output circuit configured to receive an internal voltage controlled by a voltage difference between a reference voltage and the feedback voltage, and to generate the first internal power voltage by controlling a current amount of the first external power voltage according to a potential level of the internal voltage in response to the enable signal.

12. The memory system of claim 11, wherein the second internal power voltage has a potential level lower than that of the first internal power voltage.

13. The memory system of claim 11, wherein the semiconductor memory device includes:
the internal power generating circuit configured to generate the first or second internal power voltage; and
an internal circuit configured to perform the normal operation.

14. The memory system of claim 11, wherein the internal power generating circuit includes:
a mirroring circuit enabled in response to the enable signal, the mirroring circuit being supplied with the first external power voltage, the mirroring circuit outputting the internal voltage controlled based on a difference in potential level between the reference voltage and the feedback voltage; and
a voltage switching circuit configured to switch the second external power voltage to the second internal power voltage in response to the enable signal.

15. The memory system of claim 11, wherein, in the normal operation, the output circuit generates the first internal power voltage by down-converting the first external power voltage in response to the internal voltage.

16. The memory system of claim 11, wherein the enable signal is enabled in the DPD mode, and is disabled in the normal operation.

* * * * *